United States Patent [19]

Satoh

[11] 4,173,773
[45] Nov. 6, 1979

[54] TAPE END ALARM FOR TAPE RECORDER

[75] Inventor: Ken Satoh, Hachioji, Japan

[73] Assignee: Olympus Optical Co., Ltd., Tokyo, Japan

[21] Appl. No.: 860,849

[22] Filed: Dec. 15, 1977

[30] Foreign Application Priority Data

Dec. 23, 1976 [JP] Japan ............... 51-173647[U]
Dec. 24, 1976 [JP] Japan ............... 51-173608[U]

[51] Int. Cl.$^2$ ..................... G11B 15/06; G11B 23/30
[52] U.S. Cl. ......................................... 360/67; 360/74.1
[58] Field of Search ............... 360/67, 137, 74, 90, 360/77; 340/259, 260, 62, 328; 226/45; 242/57

[56] References Cited

U.S. PATENT DOCUMENTS

| | | | |
|---|---|---|---|
| 3,497,635 | 2/1970 | Schneider | 360/74 |
| 3,562,441 | 2/1971 | Bretschneider | 360/137 X |
| 3,566,132 | 2/1971 | Walker | 360/74 X |
| 3,660,810 | 5/1972 | Yoshii | 360/74 X |
| 3,694,585 | 9/1972 | Goldner | 360/74 |
| 3,818,502 | 6/1974 | Chien et al. | 360/77 |
| 4,003,093 | 1/1977 | Satoh | 360/137 |
| 4,005,486 | 1/1977 | Satoh | 360/74 X |

Primary Examiner—John H. Wolff
Attorney, Agent, or Firm—Ostrolenk, Faber, Gerb & Soffen

[57] ABSTRACT

A tape end alarm is provided for a tape recorder which includes a changeover switch for selectively connecting an amplifier with a microphone during a record mode and with a magnetic head during a playback mode. The alarm comprises an alarm oscillator which is connected with the amplifier through the changeover switch during a record mode, and an alarm switch adapted to be closed in response to the detection of the end of a running tape being reached for activating the alarm oscillator. In this manner, an alarm is produced only during a record mode when the end of a running tape is reached.

3 Claims, 2 Drawing Figures

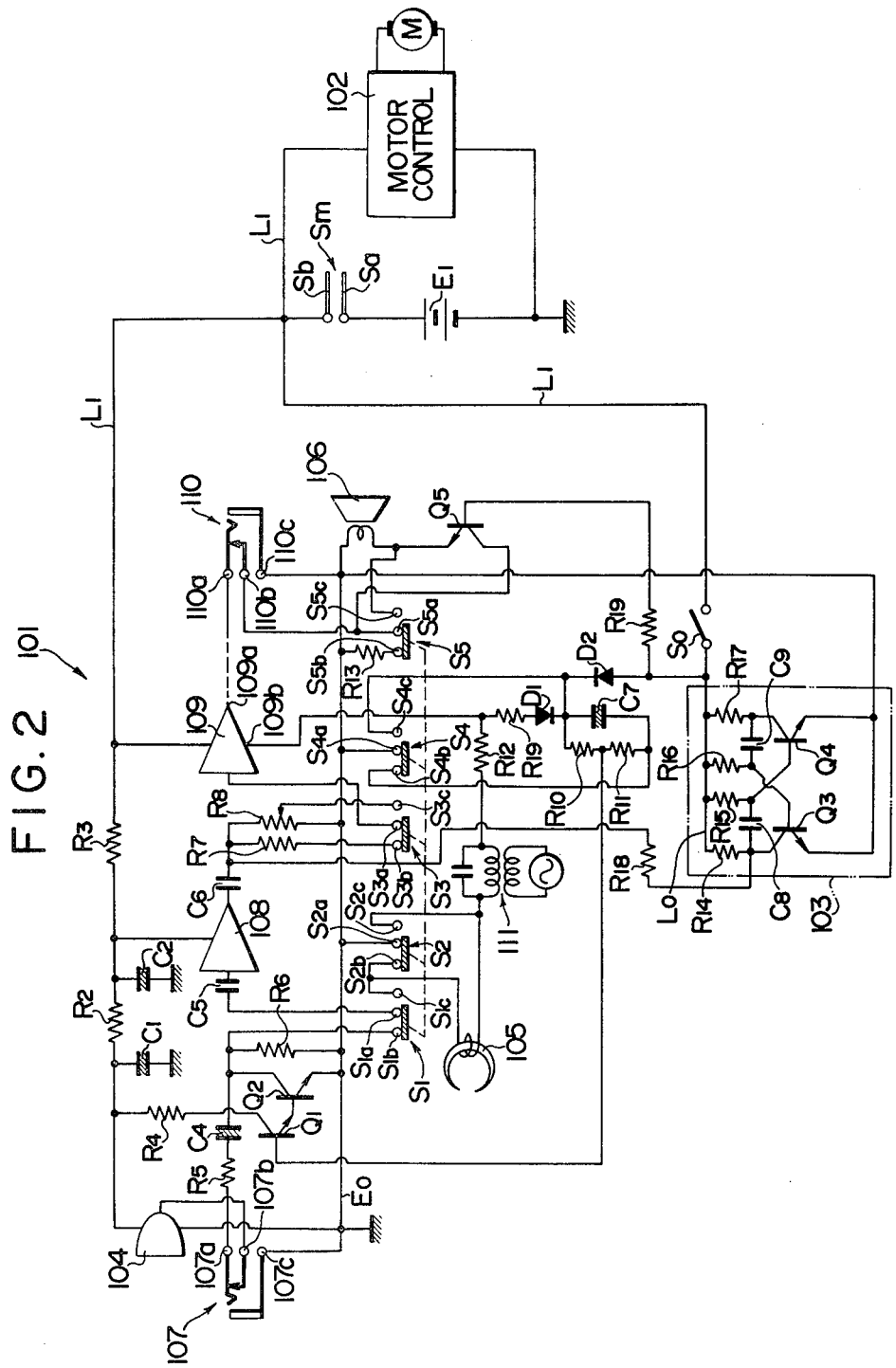

TAPE END ALARM FOR TAPE RECORDER

BACKGROUND OF THE INVENTION

The invention relates to a tape end alarm for tape recorder.

Many tape recorders are provided with an audible alarm which generates an audio alarm signal when the end of a running tape is detected. Such audible alarms are required when the tape recorder is operating in a record mode. They are not required, however, during a playback mode, since the termination of the audio signal sound being reproduced indicates that the tape has come to an end. For this reason, the production of an audible alarm signal during a playback mode is merely an annoyance. In the prior art tape recorders which include an end of tape alarm, an electrical alarm signal is usually generated by an oscillator which is enabled when an end of tape condition is reached. Particularly, a switch controlling the operation of the oscillator will normally be closed when an end of tape condition is reached and the resulting electrical alarm signal will be applied to an amplifier which energizes a loudspeaker and produces an audible alarm. The audible alarm is normally produced in both the record and playback mode unless a special changeover switch is provided. If a changeover switch is connected in the circuit to prevent the audible alarm from being produced during a playback mode, the provision of the changeover switch causes an increase in the cost of the tape recorder and requires additional space. In addition, since the changeover switch must be completely isolated from the remainder of the recorder circuit, it causes a further increase in the cost.

Another disadvantage of the prior art tape end alarms lies in the fact that during the record mode, the audible alarm is produced while the recording microphone is in its operative condition. As a consequence, when the audible alarm is produced, it is picked up by the microphone amplified by the the amplifier of the recorder, and reproduced by the loudspeaker. As a result of this feedback, sound is produced. Upon occurrence of such howling phenomenon, the audio alarm is very loud and offensive to the ear.

SUMMARY OF THE INVENTION

It is a first object of the present invention to provide a novel tape end alarm which utilizes a record/playback changeover switch provided for the purpose of selectively connecting the input terminal of an amplifier in the tape recorder with a microphone or a magnetic head, in a manner such that the alarm output is also fed through the changeover switch to the amplifier, thus dispensing with a separate changeover switch and achieving a corresponding reduction in the cost and the space requirement.

It is a second object of the invention to provide a tape end alarm of the type described above in which an AGC circuit (automatic grain control circuit) contained in the recording circuit of the tape recorder is utilized to prevent a howling phenomenon from occurring in the event an audible alarm produced by the loudspeaker is picked up by the microphone.

BRIEF DESCRIPTION OF THE DRAWINGS

FIGS. 1 and 2 are circuit diarams of tape recorders incorporating different embodiments of the tape end alarm according to the invention.

DESCRIPTION OF PREFERRED EMBODIMENTS

Figure 1:
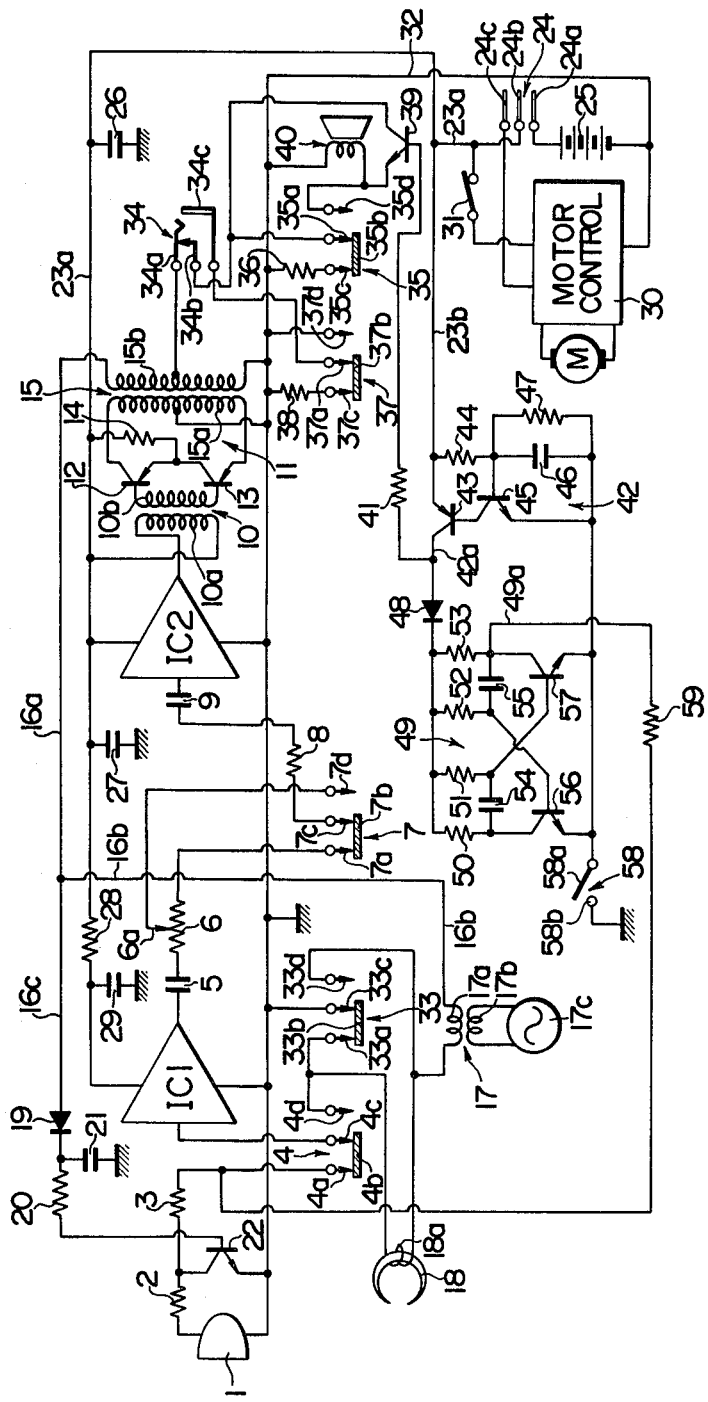

Referring to FIG. 1, there is shown a microphone 1 whose output is fed through resistors 2, 3, recording terminal 4a of a record/playback changeover switch 4. Sliding contact 4b and intermediate terminal 4c to a first amplifier IC1. The output of the first amplifier IC1 is fed through a capacitor 5, the full resistance of a variable resistor 6, recording terminal 7a of another record/playback changeover switch 7, its sliding contact 7b and intermediate terminal 7c, resistor 8 and capacitor 9 to a second amplifier IC2. The output of the second amplifier is supplied to excite the primary winding 10a of a coupling transformer 10, the secondary coil 10b of which feeds a pushpull amplifier 11. The pushpull amplifier 11 comprises a pair of transistors 12, 13 having their base each connected to one end of the secondary coil 10b with resistor 14 connected in common with the emitter of the both transistors. An output transformer 15 has a primary winding 15a which is connected across the collectors of the both transistors 12, 13, with a center tap thereof connected with a point of common potential, namely, the negative terminal of a battery 25. An output of the pushpull amplifier 11 appears across the secondary coil 15b and is fed through an output line 16a and a branch 16b to a bias circuit 17, where it is superimposed with a suitable bias and then fed to the coil 18a of a magnetic head 18 for purpose of magnetically recording a signal on a magnetic tape, not shown. The bias circuit 17 includes a bias transformer having its secondary coil 17a connected in series with the branch 16b and its primary coil 17b connected with an oscillating source 17c of a known form.

Another branch 16c is connected with the output line 16a and includes a rectifier diode 19, the cathode of which is connected with a capacitor 21 having its other end connected with the ground, and is also connected with a resistor 20, the other end of which is connected with the base of an AGC transistor 22. The collector of transistor 22 is connected with the junction between resistors 2, 3, and its emitter is connected with the other terminal of the microphone 1. The transistor 22 forms, together with the diode 19 and smoothing resistor and capacitor 20, 21, an AGC circuit which is operative to maintain a constant recording level.

The first and second amplifiers IC1 and IC2 are fed from a power supply bus 23a, which is connected with the positive terminal of the battery 25 through contacts 24a, 24b of a record/playback operating switch 24. A decoupling capacitor 26 is connected between the bus 23a and the ground in a region between the battery and the second amplifier IC2, and one end of the primary coil of the coupling transformer 10 and the other end of resistor 14 of the pushpull amplifier 11 are also connected with the bus 23a. In a region between the first and second amplifiers IC1, IC2, a decoupling circuit comprising a capacitor 27 having its other end connected with the ground, a resistor 28 and another capacitor 29 having its other end connected with the ground is connected with the bus 23a.

A motor control circuit 30 of a conventional design is connected with the contact 24b of the operating switch 24 through a normally closed pause switch 31. The operating switch 24 includes a further contact 24c which is also connected with the motor control circuit 30, which also includes another terminal connected with the negative terminal of the battery 25. When the path between the contacts 24a, 24b of the operating switch 24 is closed by an external switch operation to establish either record or playback mode, the motor control circuit 30 is activated to energize a motor M, which serves feeding a magnetic tape at a uniform rate. When all of the contacts 24a, 24b and 24c engage each other, the motor M is driven for rotation at a higher rate for cooperation with a tape feed mechanism, not shown, to perform a rapid advance or a rewind of the magnetic tape.

The negative terminal of the battery 25 is connected with a negative bus 32 to which are connected the emitter of the AGC transistor 22, the negative terminal of the first and second amplifiers IC1, IC2, the center tap of the primary coil 15a of the output transformer and one end of the secondary coil 15b thereof. One end of the coil 18a of the magnetic head 18 is also connected with the negative bus 32 through a recording contact 33a, sliding contact 33b and intermediate contact 33c of a record/playback changeover switch 33. In a region intermediate the contact 33c and the second amplifier IC2, the negative bus is connected with the body of the tape recorder.

The secondary coil 15b of the output transformer 15 has a center tape, which is connected with a stationary contact 34a of an earphone jack 34. The jack 34 also includes a movable contact 34b and another stationary contact 34c, and when the earphone is not in use, the movable contact 34b engages the stationary contact 34a as shown, but when the earphone is used, its both terminals are connected with the both stationary contacts 34a and 34c. During a record mode, the movable contact 34b is connected with the negative bus 32 through intermediate contact 35a, sliding contact 35b and recording contact 35c of the record/playback changeover switch 35 and a resistor 36 connected with the contact 35c. During a record mode, the stationary contact 34c is conneced with the negative bus 32 through intermediate contact 37a, sliding contact 37b and recording contact 37c of another record/playback changeover switch 37, and through a resistor 38 connected with the contact 37c.

The movable contact 34b is connected to the collector of a switching transistor 39, in addition to the intermediate contact 35a of the changeover switch 35, and the emitter of the transistor 39 is connected with the junction between a playback contact 35d of the changeover switch 35 and an exciting coil 40 of a loudspeaker which is connected thereto. The other end of the exciting coil is connected with the negative bus 32. The transistor 39 has its base connected with an output terminal 42a of a delay circuit 42 through resistor 41.

The delay circuit 42 is of a conventional design, and comprises a transistor 43 having its emitter connected with a branch 23b from the power supply bus 23a, a resistor 44 connected with the emitter of another transistor 45 having its collector connected with the base of the transistor 43 and its base connected with the other end of the resistor 44, a capacitor 46 connected in series with the resistor 44, and a resistor 47 connected in shunt with the capacitor 46. It will be noted that the collector of the transistor 43 is connected with the output terminal 42a.

The output terminal 42a is also connected with an audio frequency oscillator 49 through a diode 48. The oscillator 49 is formed by a well known form of multivibrator circuit including two pairs of resistors 50, 51 and 52, 53 connected in shunt with each other with the cathode of the diode 48, capacitor 54 connected across resistors 50, 51, capacitor 55 connected across resistors 52, 53, and a pair of transistors 56, 57 having their collector connected with the other end of resistors 50, 53 and having their base connected with the other end of resistors 52, 51 in crossing manner.

The emitter of the both transistor 56, 57 is connected in common and is connected with the movable contact 58a of a normally open tape end detecting switch 58. The emitter of transistor 45, the other end of capacitor 46 and resistor 47 which are contained in the delay circuit 42 are also connected with the movable contact 58a. The switch 58 includes a stationary contact 58b which is connected with the ground implemented in the form of the body of the tape recorder. The movable contact 58a is driven by a tape end detector, not shown, of a known form to close the switch 58 when the end of a running tape is reached. The switch 58 may be called, in other words, an alarm switch.

An output from the oscillator 49 is derived from an output terminal 49a which is connected with the junction between resistor 53, capacitor 55 and the collector of transistor 57. The output terminal 49a is connected through resistor 59 with the junction between the recording contact 4a of the changeover switch 4 and resistor 3.

During a record mode, when the end of a running tape is detected and detecting switch 58 is closed oscillator 49 is activated and applies an increased potential to the base of the switching transistor 39. This increased potential renders transistor 39 conductive and connects loudspeaker 40 with the secondary coil 15b of the output transformer 15 through the jack 34. An output signal from the oscillator 49 is fed to the pushpull amplifier 11 through a path including resistor 59, changeover switch 4, first amplifier IC1, capacitor 5, the full resistance of the variable resistor 6, changeover switch 7, resistor 8, capacitor 9, second amplifier IC2 and coupling transformer 10, whereby an amplified output is induced across the secondary coil 15b of the output transformer 15 and is transmitted through the jack 34 and transistor 39 to be reproduced by the loudspeaker 40 as an audible alarm.

The purpose of the delay circuit 42 is to suppress the operation of the oscillator 49 and the switching transistor 39 for a predetermined time interval determined by the time constant of resistor 44 and capacitor 46 is order to prevent an audible alarm from being produced in the event the tape end detecting switch 58 is inadvertently closed due to oscillations or vibrations.

All of the record/playback changeover switches 4, 7, 33, 35 and 37 are constructed such that their sliding contacts 4b, 7b, 33b, 35b and 37b are simultaneously driven for sliding movement in response to an external switching operation. During a record mode, these sliding contacts assume a position as shown in which the intermediate contacts 4c, 7c, 33c, 35a and 37a are connected wih recording contacts 4a, 7a, 33a, 35c and 37c, respectively, while during a playback mode, they assume a playback position (not shown) in which the intermediate contacts are disengaged from the respective recording contacts and are connected with respective playback contacts 4d, 7d, 35d and 37d, respectively.

When neither record nor playback mode is established, the intermediate contacts assume a position in which they engage neither recording nor playback contacts.

When the sliding contacts 4b, 7b, 33b, 35b and 37b of the record/playback changeover switches 4, 7, 33, 35 and 37 assume their respective playback positions, a signal reproduced from a running tape by the magnetic head 18 is fed to the first amplifier IC1 through an path including playback contact 4d of changeover switch 4, sliding contact 4b and intermediate contact 4c thereof. Thereafter, it passes through a further path including capacitor 5, movable tap 6a of variable resistor 6, playback contact 7d of changeover switch 7, its sliding contact 7b and its intermediate contact 7c, resistor 8, capacitor 9, second amplifier IC2, coupling transformer 10 and pushpull amplifier 11 to appear across the secondary coil 15b of the output transformer 15. Thereafter it is fed to the exciting coil of the loudspeaker 40 through jack 34, and intermediate contact 35a, sliding contact 35b and playback contact 35d of the changeover switch 35, thus allowing it to be reproduced by the loudspeaker 40 as an audible sound. It will be noted that in the playback mode the recording contact 4a of the changeover switch 4 which is connected with the output terminal 49a of the oscillator 49 is disconnected from the path extending from the magnetic head 18 to the loudspeaker 40, so that no audible alarm is produced by the loudspeaker 40 in the event the tape end detecting switch 58 is closed in response to the detection of a tape end. In this manner, the audible alarm of the present invention generates an audio alarm signal only during a record mode, and not during a playback mode.

Referring to FIG. 2, another arrangement will be described below which prevents the howling phenomenon that may be caused by an audible alarm. There is shown a power source $E_1$, the positive terminal of which is connected with a movable contact Sa of a main switch Sm of the tape recorder. The switch Sm comprises a pair of movable blade contacts Sa, Sb which engage each other when a record button or a playback button (not shown) of the tape recorder is operated, thereby connecting the source $E_1$ with an audio amplifier 101 and a motor circuit 102 of the tape recorder.

The movable blade contact Sb is connected with a positive supply bus $L_1$ which supplies power to the circuits 101, 102 and an end alarm signal generator 103 to be described later. The negative terminal of the source $E_1$ is connected with the ground as is the negative bus $E_0$ of the audio amplifier 101 and the generator 103 while the negative bus of the motor circuit 102 is connected directly with the negative terminal of the source $E_1$. As is well known, the audio amplifier 101 operates to amplify a voice output from a microphone 104 to feed a record/playback head 105 during a record mode, and to amplify a reproduced output from the head 105 to feed a loudspeaker 106.

Specifically describing the circuit arrangement, the output terminal of the microphone 104 is connected with a movable contact 107b of a jack 107 which is adapted to be connected with an external microphone. The supply terminal of the microphone 104 is connected with the positive supply bus $L_1$ through decoupling circuits, each comprising resistor R2 and capacitor C1, and resistor R3 and capacitor C2, and is also connected with the collector of AGC (automatic gain control) transistor Q1 through resistor R4. The transistor Q1 has its emitter connected with the base of another AGC transistor Q2, the emitter of which is connected with the negative bus $E_0$. The collector of the transistor Q2 is connected with one stationary contact S1b of a switch S1. The other terminal of the microphone 104 is connected to the negative bus $E_0$ together with the other stationary contact 107c of the jack 107.

Normally, the movable contact 107b of the jack 107 engages the stationary contact 107a, which is connected through a series combination of resistor R5 and capacitor C4 with one stationary contact S1b of the record/playback changeover switch S1. The switch S1 is ganged with other record/playback changeover switches S2, S3, S4 and S5, and all of these switches are operated so that their movable contacts engage their respective switching contacts S1a to S5a and one stationary contacts S1b to S5b when a record mode of the tape recorder is established by the operation of a record button, thus rendering the audio amplifier 101 operative during the record mode. When a playback mode of the tape recorder is established by operating a playback button, the movable contacts of the switches S1 to S5 engage switching contacts S1a to S5a and the other stationary contacts S1c to S5c, changing the circuit connection of the audio amplifier 101.

The stationary contact S1b of the changeover switch S1 is connected with the negaive bus $E_0$ through resistor R6. The switching contact S1a of the switch S1 is connected with the input terminal of a first amplifier 108 through capacitor C5, and the other stationary contact S1c of the switch S1 is connected with one end of the record/playback head 105 together with one stationary contact S2b of the switch S2. The switching contact S2a of the switch S2 is connected with the negative bus $E_0$ while its stationary contact S2c is connected with the other end of the head 105. The output terminal of the first amplifier 108 is connected through a series combination of capacitor C6 and resistor R7 with one stationary contact S3b of the switch S3, the other stationary contact S3c of which is connected with a movable tap on a variable resistor R8 which represents a volume control. The variable resistor R8 is connected between the junction between the capacitor C6 and resistor R7 and the negative bus $E_0$. The switching contacts S3a of the switch S3 is connected with the input terminal of a second amplifier 109, which has one output terminal 109a which is connected with one stationary contact 110a of a jack 110 through a power amplifier, not shown, the jack 110 being adapted to receive a monitor earphone.

The second amplifier 109 has another output terminal 109b which is connected with the stationary contact S4b of the switch S4 through a series circuit including resistor R9, diode D1 and capacitor C7. The switching contact S4a of the switch S4 is connected with the ground, and its other stationary contact S4c is connected with the junction between the diode D1 and capacitor C7. The series circuit comprising resistor R9, diode D1 and capacitor C7 operates to supply an AGC voltage, and the junction between resistors R10 and R11 connected in series across the capacitor C7 is connected with the base of AGC transistor Q1. The output terminal 109b is also connected with a bias oscillator 111 through resistor R12, and the output of the bias oscillator 111 is connected with the other end of the head 105.

The earphone jack 110 includes a movable contact 110b which is normally maintained in engagement with the stationary contact 110a and is connected with the switching contact S5a of the switch S5. The jack 110 also includes another stationary contact 110c which is connected with the ground. The stationary contact S5b of the switch S5 is connected with the ground through resistor R13, and its other stationary contact S5c is connected with the exciting coil of a loudspeaker 106, the other end of which is connected with the negative bus $E_0$.

The end alarm signal generator 103 comprises an audio frequency oscillator formed by a flipflop circuit of a known form. The generator 103 is fed from the source $E_1$ through a tape end detecting switch $S_0$, which respresents a normally open switch and which can be closed when it is detected that the terminal end of the running tape is reached. One end of the switch $S_0$ is connected with the movable contact Sb of the main switch Sm and its other end is connected with the positive supply bus $L_1$. The switch $S_0$ may be called, in other words, an alarm switch.

The generator 103 comprises a pair of transistors Q3, Q4 interconnected by resistors R14 to R17 and capacitors C8, C9 in a symmetrical manner. Specifically, a capacitor C9 is connected between the base of transistor Q3 and the collector of transistor Q4 while capacitor C8 is connected between the base of transistor Q4 and the collector of transistor Q3. Resistor R14 is connected between the collector of transistor Q3 and the bus $L_1$ while resistor R17 is connected between the collector of transistor Q4 and the bus $L_1$. Resistor R15 is connected between the base of transistor Q4 and the bus $L_1$ while resistor R16 is connected between the base of transistor Q3 and the bus $L_1$. The both transistors Q3, Q4 have their emitter connected in common and connected with the negative bus $E_0$.

The output of the generator 103 is fed through resistor R18 to the secnd amplifier 109. One end of resistor R18 is connected with the collector of transistor Q3 while its other end is connected with the junction between capacitor C6 and resistor R7 contained in the audio amplifier 101. When the end alarm signal generator 103 is operating, the loudspeaker 106 is connected with the output terminal of the audio amplifier 101 through a switching transistor Q5 which then conducts. Specifically, the switching transistor Q5 has its emitter connected with the stationary contact S5c of the switch S5, its collector connected with the switching contact S5a and its base connected with the positive supply bus $L_1$ through resistor R19.

In operation of the tape recorder including the tape end alarm, the tape end detecting switch $S_0$ is closed upon the end of a running tape being reached during a record mode of the tape recorder. Upon closure of the switch $S_0$, the switching transistor Q5 is turned on, connecting the loudspeaker 106 with the output terminal of the audio amplifier 101. The end alarm signal generator 103 is activated, producing an alarm signal of a given frequency. The alarm signal is fed through resistors R18 and R7 and switch S3 to the second amplifier 109, and then to loudspeaker 106 which generates an audible alarm signal. This indicates that an end of tape condition has been reached and that no more tape is available. In FIG. 2, it will be noted that the junction between the rectifier diode D1 and the smoothing capacitor C7 of the AGC circuit is connected with one end of a diode D2, the other end of which is connected with the positive supply bus $L_1$. With this arrangement, when the detecting switch $S_0$ is closed to activate the generator 103, a d.c. voltage is applied simultaneously to the capacitor C7 through diode D2, thus charging the capacitor. The voltage across the capacitor is supplied as an AGC voltage to the base of the AGC transistor Q1. In response thereto, the AGC transistors Q1, Q2 perform an automatic gain control operation to compress the alarm signal as it is picked up by the microphone 104 when the signal is given off by the loudspeaker 106, thus preventing such signal from being supplied to the first amplifier 108. Thus, any amount of audible alarm which is picked up by the microphone 104 cannot cause the howling phenomenon, permitting the audible alarm to be produced as a clearly intelligible sound of audio frequency.

What is claimed is:

1. A tape end alarm for a tape recorder of the type which includes change-over switch means movable between a record position, wherein said change-over switch means connects the output of a microphone to the input of an amplifier, and a playback position, wherein said change-over switch means connects the output of a magnetic head to said input of said amplifier, said tape end alarm comprising:

a tape end detection switch adapted to be closed upon the detection of a terminal end of a running tape being reached;

alarm oscillator means which is connected to said amplifier by said change-over switch means when said change-over switch means is in said record position and generates an oscillating signal responsive to the closure of said tape end detection switch;

an AGC circuit for controlling the gain of said microphone output when it is connected to said input of said amplifier; and means for decreasing the gain of said AGC circuit responsive to the closure of said tape end detection switch by a sufficient amount to prevent a howling phenomena which may be caused by an audible alarm given off by said loudspeaker and fed through a closed loop including the loudspeaker, the microphone, the amplifier and back to the loudspeaker.

2. A tape end alarm according to claim 1 wherein said AGC circuit includes a transistor whose gain determines the gain of said AGC circuit, the gain of said transistor being determined by a control voltage applied to a control electrode of said transistor, and wherein said means for decreasing the gain of said AGC circuit includes a capacitor coupled to said alarm oscillator means in such a manner that the change across said capacitor changes responsive to the generation of said oscillating signal, said capacitor being coupled to said control electrode of said transistor in such a manner that the gain of said transistor is reduced when said oscillating signal is applied to said capacitor.

3. A tape end alarm according to claim 1 wherein said oscillating signal generated by said oscillator means is applied to said capacitor via a diode.

* * * * *